(12) United States Patent
Ker et al.

(10) Patent No.: US 9,728,530 B1
(45) Date of Patent: Aug. 8, 2017

(54) BIPOLAR TRANSISTOR DEVICE

(71) Applicant: AMAZING MICROELECTRONIC CORP., New Taipei (TW)

(72) Inventors: Ming-Dou Ker, Hsinchu County (TW); Woei-Lin Wu, Hsinchu County (TW); James Jeng-Jie Peng, Taoyuan County (TW); Ryan Hsin-Chin Jiang, Taipei (TW)

(73) Assignee: Amazing Microelectronic Corp., New Taipei (TW)

( * ) Notice: Subject to any disclaimer, the term of this patent is extended or adjusted under 35 U.S.C. 154(b) by 0 days.

(21) Appl. No.: 15/384,736

(22) Filed: Dec. 20, 2016

(51) Int. Cl.
| H01L 27/102 | (2006.01) |
| H01L 27/02 | (2006.01) |
| H01L 29/732 | (2006.01) |
| H01L 27/082 | (2006.01) |
| H01L 29/36 | (2006.01) |

(52) U.S. Cl.
CPC ...... H01L 27/0259 (2013.01); H01L 27/0826 (2013.01); H01L 29/36 (2013.01); H01L 29/732 (2013.01)

(58) Field of Classification Search
None
See application file for complete search history.

(56) References Cited

U.S. PATENT DOCUMENTS

| 7,700,449 | B2* | 4/2010 | Lee ................. H01L 21/823431 257/350 |
| 8,779,517 | B2 | 7/2014 | Lin et al. |
| 9,082,623 | B2* | 7/2015 | Yang ................. H01L 27/0288 |
| 9,177,951 | B2* | 11/2015 | Singh ............... H01L 29/41708 |
| 9,368,484 | B1 | 6/2016 | Chen et al. |
| 9,502,883 | B2* | 11/2016 | Huh ..................... H01L 27/027 |

FOREIGN PATENT DOCUMENTS

| CN | 103715261 B | 4/2016 |
| TW | 201351486 A | 12/2013 |

* cited by examiner

*Primary Examiner* — Benjamin Sandvik
(74) *Attorney, Agent, or Firm* — Rosenberg, Klein & Lee

(57) ABSTRACT

A bipolar transistor device includes a substrate and at least one first transistor unit. The first transistor unit includes a first doped well of first conductivity type, at least one first fin-based structure and at least one second fin-based structure. The first fin-based structure includes a first gate strip and first doped fins arranged in the first doped well, and the first gate strip is floating. The second fin-based structure includes a second gate strip and second doped fins arranged in the first doped well, and the second gate strip is floating. The first doped fins, the second doped fins and the first doped well form first BJTs, and the first doped fins and the second doped fins are respectively coupled to high and low voltage terminals.

14 Claims, 9 Drawing Sheets

BIPOLAR TRANSISTOR DEVICE

BACKGROUND OF THE INVENTION

Field of the Invention

The present invention relates to a transistor device, particularly to a bipolar transistor device.

Description of the Related Art

The semiconductor industry has experienced rapid growth due to continuous improvements in the integration density of a variety of electronic components (e.g., transistors, diodes, resistors, capacitors, etc.).

For the most part, this improvement in integration density has come from repeated reductions in minimum feature size, which allows more components to be integrated into a given area. However, the smaller feature size may lead to more leakage current. As the demand for even smaller electronic devices has grown recently, there has grown a need for reducing leakage current of semiconductor devices.

As semiconductor technologies evolve, fin field effect transistors (FinFETs) have emerged as an effective alternative to further reduce leakage current in semiconductor devices. In a FinFET, an active region including the drain, the channel region and the source protrudes up from the surface of the semiconductor substrate upon which the FinFET is located. The active region of the FinFET, like a fin, may be rectangular in shape from a cross section view. In addition, the gate structure of the FinFET wraps the active region around three sides like an upside-down U. As a result, the gate structure's control of the channel has become stronger. The short channel leakage effect of conventional planar transistors has been reduced. As such, when the FinFET is turned off, the gate structure can better control the channel so as to reduce leakage current. Semiconductor devices including FinFETs are susceptible to extremely high voltage spikes such as an electrostatic discharge (ESD) transient. ESD is a rapid discharge that flows between two objects due to the built-up of static charge. ESD may destroy semiconductor devices because the rapid discharge can produce a relatively large current.

To overcome the abovementioned problems, the present invention provides a bipolar transistor device, so as to solve the afore-mentioned problems of the prior art.

SUMMARY OF THE INVENTION

A primary objective of the present invention is to provide a bipolar transistor device, which uses two fin-based structures arranged in a doped well to establish BJTs which discharge uniform electrostatic discharge (ESD) currents, so as to reduce the semiconductor failures due to ESD.

To achieve the abovementioned objectives, the present invention provides a bipolar transistor device, which comprises a substrate and at least one first transistor unit. For example, the substrate is a semiconductor substrate. The first transistor unit further comprises a first doped well of first conductivity type arranged in the substrate, at least one first fin-based structure and at least one second fin-based structure.

The first fin-based structure further comprises a first gate strip, a plurality of first doped fins and two first contacts. The first gate strip comprises polysilicon. The first doped fins are uniformly arranged in the first doped well, and arranged along a first direction, and each first doped fin has a first doped region of the first conductivity type and two first heavily doped regions of second conductivity type, and each first doped region is arranged between the two first heavily doped regions corresponded thereof, and the first doped regions and the first heavily doped regions are arranged in the first doped well and protruded up from a surface of the substrate. The first gate strip is arranged on tops and sidewalls of the first doped regions and the surface of the substrate, and arranged along a second direction intersecting the first direction, and the first gate strip is floating. For example, the second direction is perpendicular to the first direction. Besides, the first conductivity type is a P type and the second conductivity type is an N type. Alternatively, the first conductivity type is an N type and the second conductivity type is a P type. The first contacts are respectively arranged on sidewalls and tops of the first heavily doped regions at two opposite sides of the first doped regions and the surface of the substrate, and arranged along the second direction, and the first heavily doped regions are coupled to a high voltage terminal via the first contacts.

The second fin-based structure further comprises a second gate strip, a plurality of second doped fins and two second contacts. The second gate strip comprises polysilicon. The second doped fins are uniformly arranged in the first doped well, and arranged along the first direction, and each second doped fin has a second doped region of the first conductivity type and two second heavily doped regions of the second conductivity type, and each second doped region is arranged between the two second heavily doped regions corresponded thereof, and the second doped regions and the second heavily doped regions are arranged in the first doped well and protruded up from the surface of the substrate. The second gate strip is arranged on tops and sidewalls of the second doped regions and the surface of the substrate, and arranged along the second direction, and the second gate strip is floating. The second contacts are respectively arranged on sidewalls and tops of the second heavily doped regions at two opposite sides of the second doped regions and the surface of the substrate, and arranged along the second direction, and the second heavily doped regions are coupled to a low voltage terminal via the second contacts.

The first heavily doped regions, the second heavily doped regions and the first doped well form a plurality of first bipolar junction transistors (BJTs). Voltages of the high voltage terminal and the low voltage terminal bias the first BJTs to generate a plurality of first electrostatic discharge (ESD) currents through the first BJTs.

In the first embodiment, the amount of the first transistor unit, the first fin-based structure and the second fin-based structure are respectively one, one, and one.

In the second embodiment, there are a plurality of the first fin-based structures and a plurality of the second fin-based structures. The first fin-based structures and the second fin-based structures are arranged in an alternate way.

In the third embodiment, the amounts of the first transistor unit, the first fin-based structure and the second fin-based structure are respectively one, two, and one. The first transistor unit further comprises a first doped area of the second conductivity type arranged in the first doped well. For example, the first doped area is a doped well. The second fin-based structure is arranged between the first fin-based structures. The second heavily doped regions and the second doped regions are arranged in the first doped area, and the second gate strip is arranged between the first gate strips, and the second gate strip is connected with the first gate strips.

In the fourth embodiment, the amounts of the first transistor unit, the first fin-based structure and the second fin-based structure are respectively two, two, and one. The first transistor unit of the third embodiment is the same to that of the fourth embodiment. Compared with the third embodiment, the fourth embodiment further comprises at least one second transistor unit. The second transistor unit further comprises a second doped well of the second conductivity type, a second doped area of the first conductivity type, two third fin-based structures and a fourth fin-based structure. For example, the second doped area is a doped well. The second doped well is arranged in the substrate, and the second doped area is arranged in the second doped well.

Each third fin-based structure comprises a third gate strip, a plurality of third doped fins and two third contacts. The third gate strip comprises polysilicon. The third doped fins are uniformly arranged in the second doped well, and arranged along the first direction, and each third doped fin has a third doped region of the second conductivity type and two third heavily doped regions of the first conductivity type, and each third doped region is arranged between the two third heavily doped regions corresponded thereof, and the third doped regions and the third heavily doped regions are arranged in the second doped well and protruded up from the surface of the substrate, and the third heavily doped regions are coupled to the low voltage terminal. The third gate strip is arranged on tops and sidewalls of the third doped regions and the surface of the substrate, and arranged along the second direction, and the third gate strip is floating. The third contacts are respectively arranged on sidewalls and tops of the third heavily doped regions at two opposite sides of the third doped regions and the surface of the substrate, and arranged along the second direction, and the third heavily doped regions are coupled to the low voltage terminal via the third contacts.

The fourth fin-based structure comprises a fourth gate strip, a plurality of fourth doped fins and two fourth contacts. The fourth gate strip comprises polysilicon. The fourth doped fins are uniformly arranged in the second doped area, and arranged along the first direction, and each fourth doped fin has a fourth doped region of the first conductivity type and two fourth heavily doped regions of the second conductivity type, and each fourth doped region is arranged between the two fourth heavily doped regions corresponded thereof, and the fourth doped regions and the fourth heavily doped regions are arranged in the second doped area and protruded up from the surface of the substrate, and the fourth heavily doped regions are coupled to the high voltage terminal. The fourth gate strip is arranged on tops and sidewalls of the fourth doped regions and the surface of the substrate, and arranged along the second direction, and the fourth gate strip is floating. The fourth contacts are respectively arranged on sidewalls and tops of the fourth heavily doped regions at two opposite sides of the fourth doped regions and the surface of the substrate, and arranged along the second direction, and the fourth heavily doped regions are coupled to the high voltage terminal via the fourth contacts.

The fourth gate strip is arranged between the third gate strips, and the fourth gate strip is connected with the third gate strips. The third heavily doped regions, the fourth heavily doped regions, the second doped well and the second doped area form a plurality of second BJTs, and the voltages of the high voltage terminal and the low voltage terminal bias the second BJTs to generate a plurality of second ESD currents through the second BJTs. The first doped wells are adjacent to the second doped well in an alternate way, and the first doped areas are adjacent to the second doped area in an alternate way.

In addition, there are also a plurality of first transistor units and a plurality of second transistor units in the fourth embodiment. Each second transistor unit corresponds to two first transistor units.

Below, the embodiments are described in detail in cooperation with the drawings to make easily understood the technical contents, characteristics and accomplishments of the present invention.

DETAILED DESCRIPTION OF THE INVENTION

Figure 1:
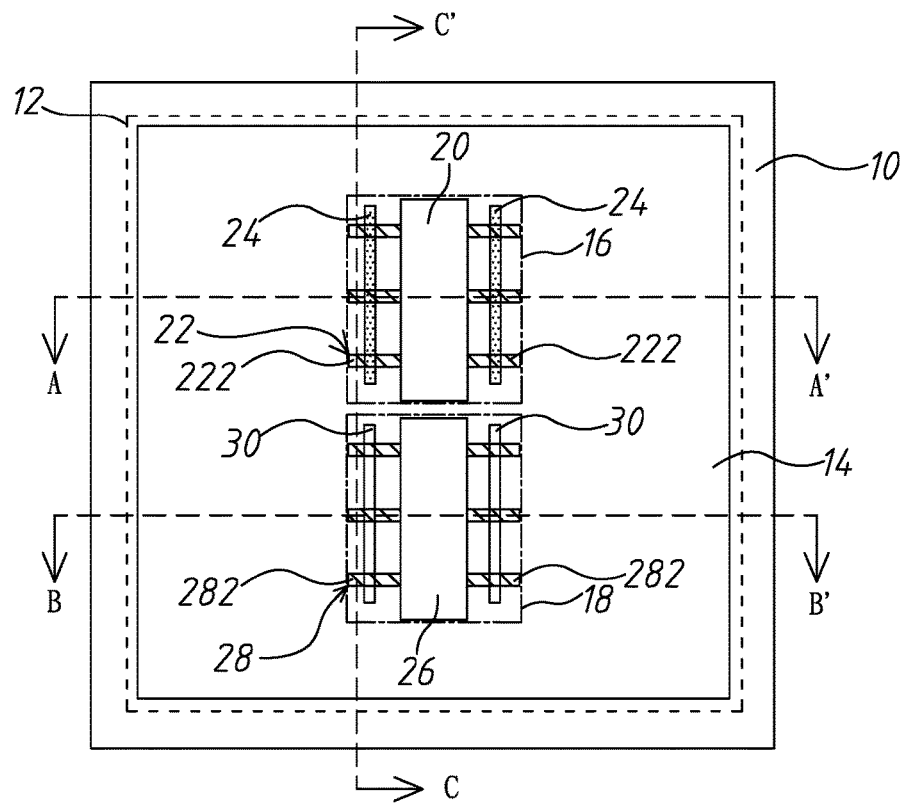
FIG. 1 is a layout schematically showing a bipolar transistor device according to the first embodiment of the present invention.
Figure 2:
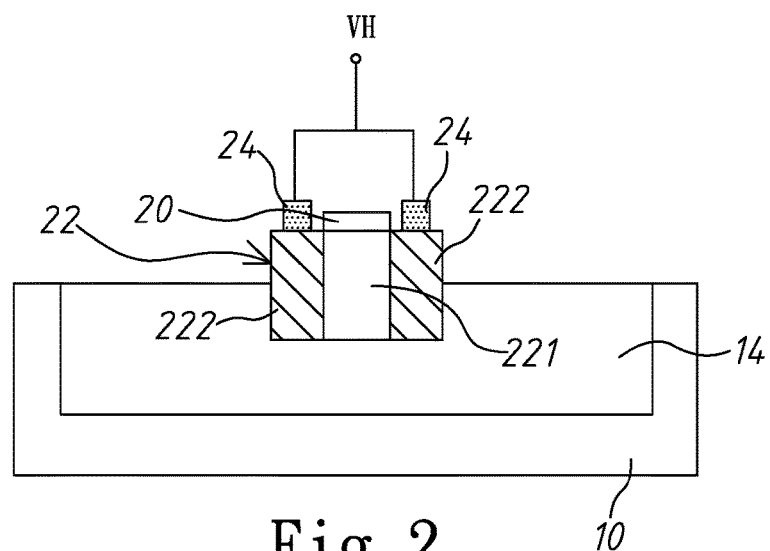
FIG. 2 is a sectional view taken along Line A-A' of FIG. 1.
Figure 3:
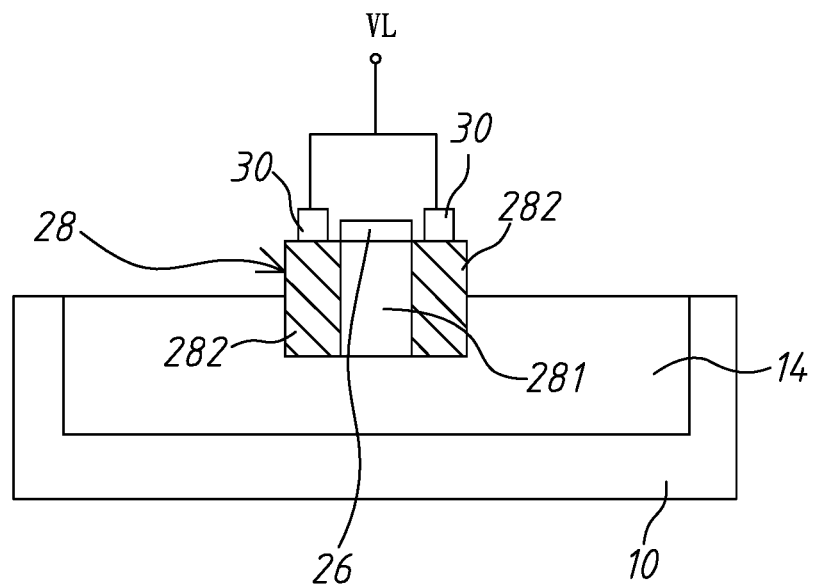
FIG. 3 is a sectional view taken along Line B-B' of FIG. 1.
Figure 4:
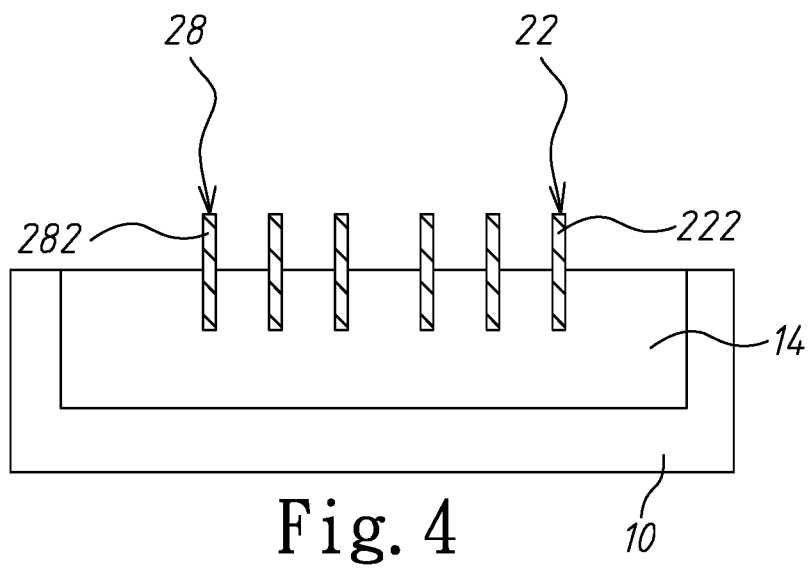
FIG. 4 is a sectional view taken along Line C-C' of FIG. 1.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

The bipolar transistor device of the present invention is used as an electrostatic discharge (ESD) protection structure needed for integrated circuits. In ESD protection, an ESD circuit is formed near integrated circuit terminals such as input and output pads, and also for power supply terminals. ESD protection circuits may provide a current discharge path so as to reduce the semiconductor failures due to ESD.

Refer to FIG. 1, FIG. 2, FIG. 3 and FIG. 4. The first embodiment of the bipolar transistor device of the present invention is introduced as below. The first embodiment of the present invention comprises a substrate 10 and at least one first transistor unit 12. For example, the substrate 10 is a semiconductor substrate. The first transistor unit 12 further comprises a first doped well 14 of first conductivity type arranged in the substrate 10, at least one first fin-based structure 16 and at least one second fin-based structure 18. The first fin-based structure 16 and the second fin-based structure 18 are independent devices. There is no electrode shared between the first fin-based structure 16 and the second fin-based structure 18.

The first fin-based structure 16 further comprises a first gate strip 20, a plurality of first doped fins 22 and two first contacts 24. The first gate strip 20 comprises polysilicon. The first doped fins 22 are uniformly arranged in the first doped well 14, and arranged along a first direction, and each first doped fin 22 has a first doped region 221 of the first conductivity type and two first heavily doped regions 222 of second conductivity type, and each first doped region 221 is arranged between the two first heavily doped regions 222 corresponded thereof, and the first doped regions 221 and the first heavily doped regions 222 are arranged in the first doped well 14 and protruded up from a surface of the substrate 10. The first gate strip 20 is arranged on tops and sidewalls of the first doped regions 221 and the surface of the substrate 10, and arranged along a second direction intersecting the first direction, and the first gate strip 20 is floating. For example, the second direction is perpendicular to the first direction. The first contacts 24 are respectively used as a source and a drain. The first contacts 24 are respectively arranged on sidewalls and tops of the first heavily doped regions 222 at two opposite sides of the first doped regions 221 and the surface of the substrate 10, and arranged along the second direction, and the first heavily doped regions 222 are coupled to a high voltage terminal VH via the first contacts 24.

The second fin-based structure 18 further comprises a second gate strip 26, a plurality of second doped fins 28 and two second contacts 30. The second gate strip 26 comprises polysilicon. The second doped fins 28 are uniformly arranged in the first doped well 14, and arranged along the first direction, and each second doped fin 28 has a second doped region 281 of the first conductivity type and two second heavily doped regions 282 of the second conductivity type, and each second doped region 281 is arranged between the two second heavily doped regions 282 corresponded thereof, and the second doped regions 281 and the second heavily doped regions 282 are arranged in the first doped well 14 and protruded up from the surface of the substrate 10. The second gate strip 30 is arranged on tops and sidewalls of the second doped regions 281 and the surface of the substrate 10, and arranged along the second direction, and the second gate strip 30 is floating. The second contacts 30 are respectively used as a source and a drain, respectively arranged on sidewalls and tops of the second heavily doped regions 282 at two opposite sides of the second doped regions 281 and the surface of the substrate 10, and arranged along the second direction, and the second heavily doped regions 282 are coupled to a low voltage terminal VL via the second contacts 30.

In the first embodiment, the amount of the first transistor unit 12, the first fin-based structure 16 and the second fin-based structure 18 are respectively one, one, and one.

Figure 5:
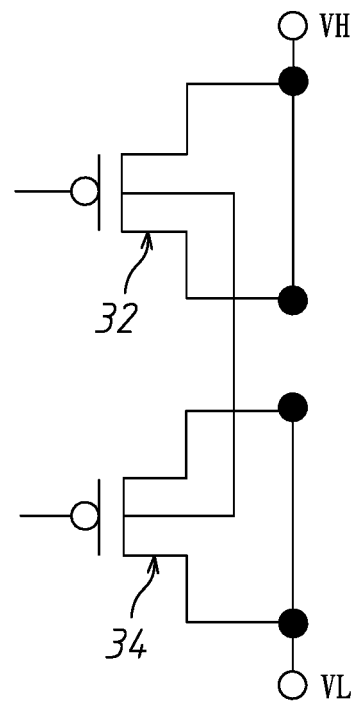
FIG. 5 is a diagram schematically showing an equivalent circuit of a bipolar transistor device according to the first embodiment of the present invention.
Figure 6:
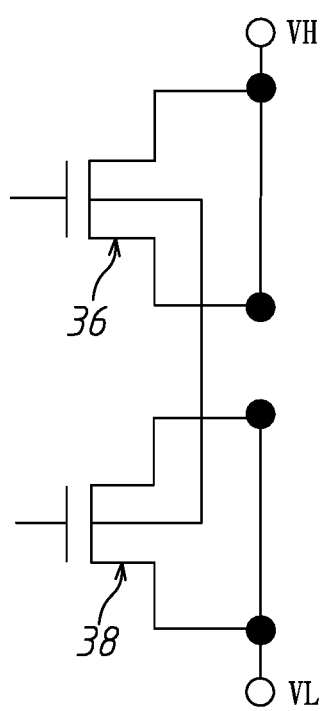
FIG. 6 is a diagram schematically showing another equivalent circuit of a bipolar transistor device according to the first embodiment of the present invention.
Figure 7:
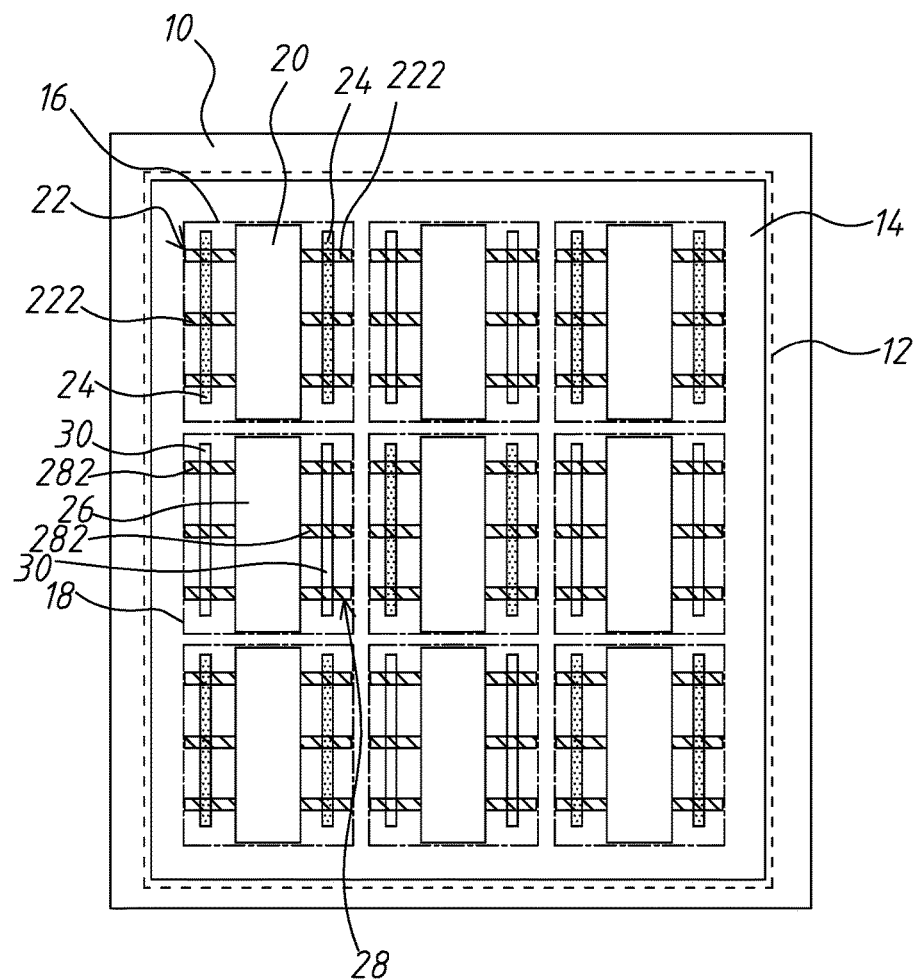
FIG. 7 is a layout schematically showing a bipolar transistor device according to the second embodiment of the present invention.
Figure 8:
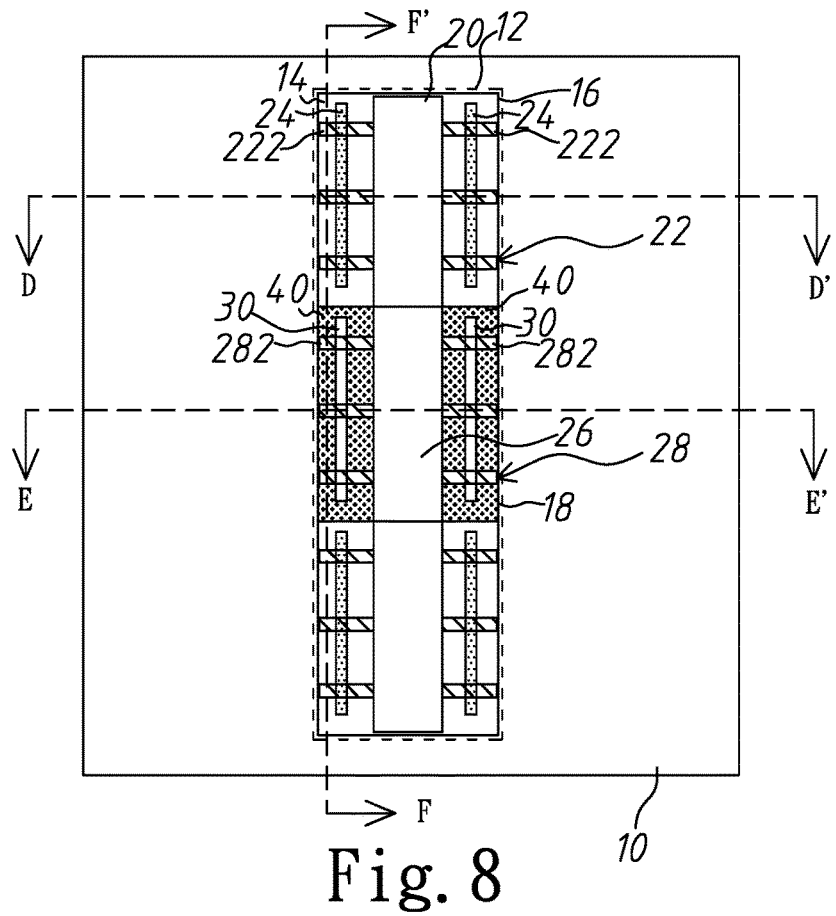
FIG. 8 is a layout schematically showing a bipolar transistor device according to the third embodiment of the present invention.
Figure 9:
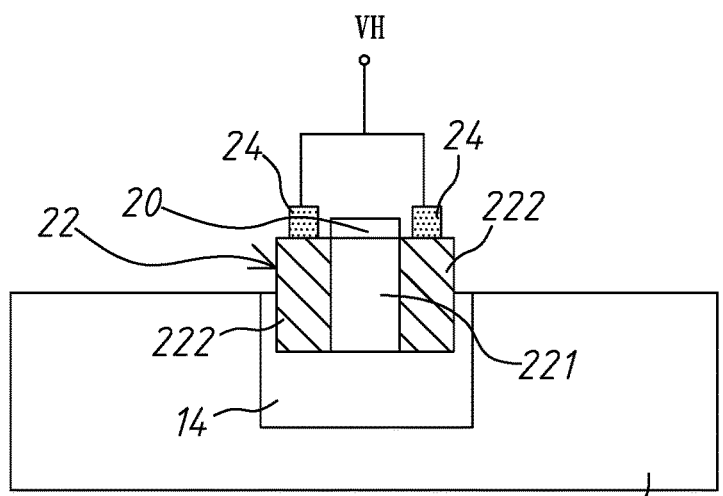
FIG. 9 is a sectional view taken along Line D-D' of FIG. 8.
Figure 10:
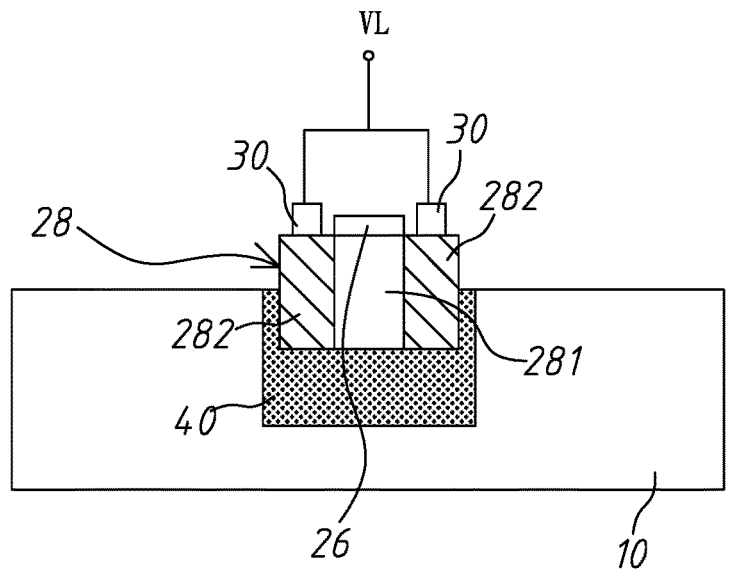
FIG. 10 is a sectional view taken along Line E-E' of FIG. 8.
Figure 11:
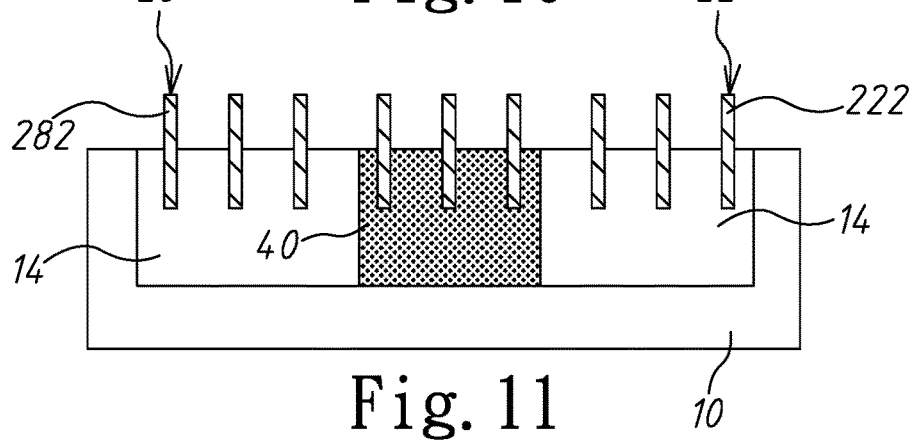
FIG. 11 is a sectional view taken along Line F-F' of FIG. 8.

Besides, the first conductivity type is an N type and the second conductivity type is a P type. In such a case, the first fin-based structure 16 cooperates with the first doped well 14 to form a PMOSFET 32, and the second fin-based structure 18 cooperates with the first doped well 14 to form a PMOSFET 34, as shown in FIG. 5. Alternatively, the first conductivity type is a P type and the second conductivity type is an N type. In such a case, the first fin-based structure 16 cooperates with the first doped well 14 to form an NMOSFET 36, and the second fin-based structure 18 cooperates with the first doped well 14 to form an NMOSFET 38, as shown in FIG. 6. The first heavily doped regions 222, the second heavily doped regions 282 and the first doped well 14 form a plurality of first bipolar junction transistors (BJTs). Voltages of the high voltage terminal VH and the low voltage terminal VL bias the first BJTs to generate a plurality of first electrostatic discharge (ESD) currents through the first BJTs. In the first embodiment, the first ESD currents flow in a single direction.

Refer to FIG. 1, FIG. 2, FIG. 3, FIG. 4 and FIG. 7. The second embodiment of the bipolar transistor device of the present invention is introduced as below. The second embodiment of the present invention is different from the first embodiment in the amounts of the first fin-based structures 16 and a plurality of the second fin-based structures 18. In the second embodiment, there are a plurality of the first fin-based structures 16 and a plurality of the second fin-based structures 18. The first fin-based structures 16 and the second fin-based structures 18 are arranged in an alternate way. In the second embodiment, the first ESD currents flow in up, down, left and right directions.

Refer to FIG. 1, FIG. 8, FIG. 9, FIG. 10, and FIG. 11. The third embodiment of the bipolar transistor device of the present invention is introduced as below. The difference between the first embodiment and the third embodiment is described as below. In the third embodiment, the amounts of the first transistor unit 12, the first fin-based structures 16 and the second fin-based structure 18 are respectively one, two, and one. Compared with the first embodiment, the first transistor unit 12 of the third embodiment further comprises a first doped area 40 of the second conductivity type arranged in the first doped well 14. For example, the first doped area 40 is a heavily doped well. The second fin-based structure 18 is arranged between the two first fin-based structures 16. The second heavily doped regions 282 and the second doped regions 281 are arranged in the first doped area 40, and the second gate strip 26 is arranged between the first gate strips 20, and the second gate strip 26 is connected with the first gate strips 20.

Figure 12:
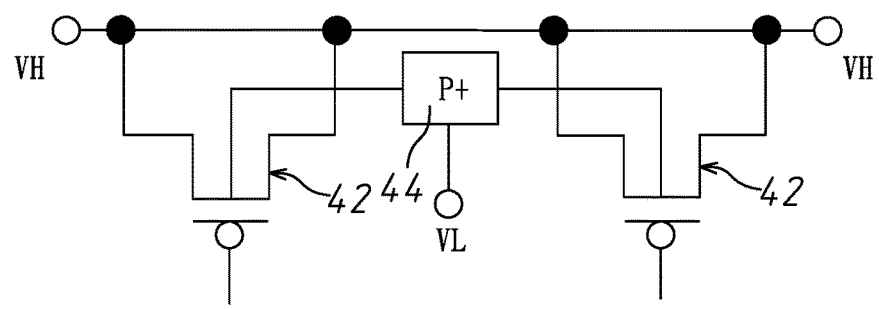
FIG. 12 is a diagram schematically showing an equivalent circuit of a bipolar transistor device according to the third embodiment of the present invention.
Figure 13:
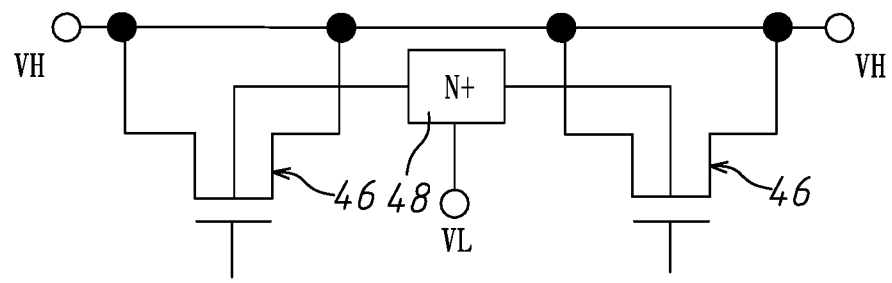
FIG. 13 is a diagram schematically showing another equivalent circuit of a bipolar transistor device according to the third embodiment of the present invention.
Figure 14:
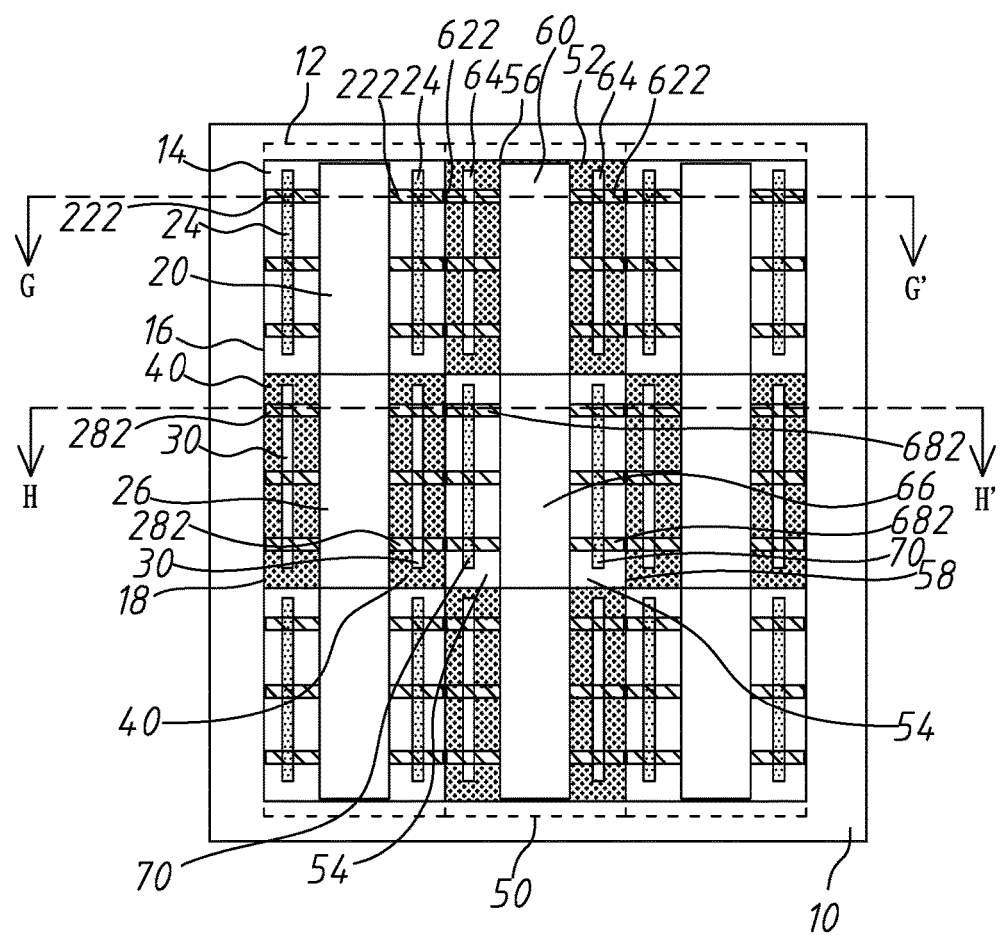
FIG. 14 is a layout schematically showing a bipolar transistor device according to the fourth embodiment of the present invention.
Figure 15:
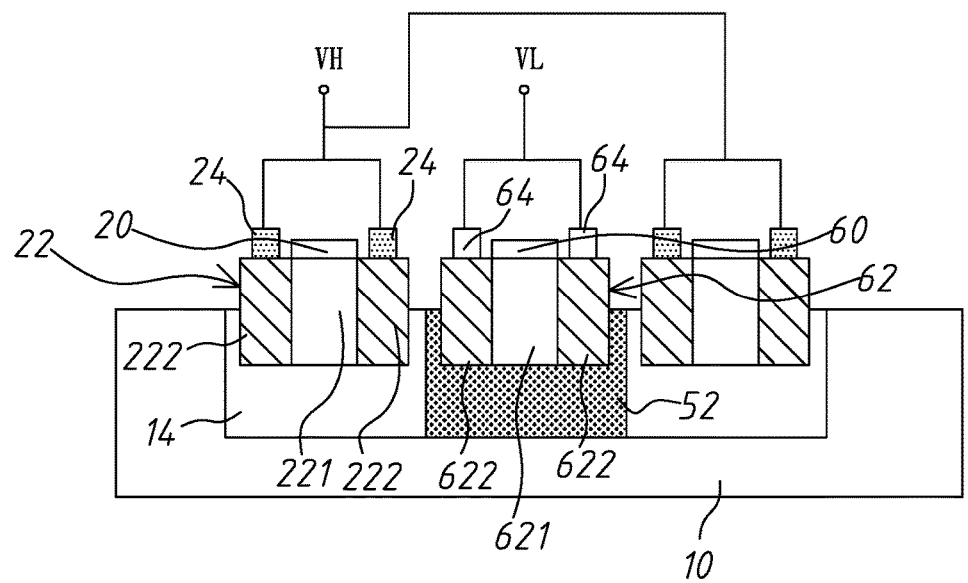
FIG. 15 is a sectional view taken along Line G-G' of FIG. 14.
Figure 16:
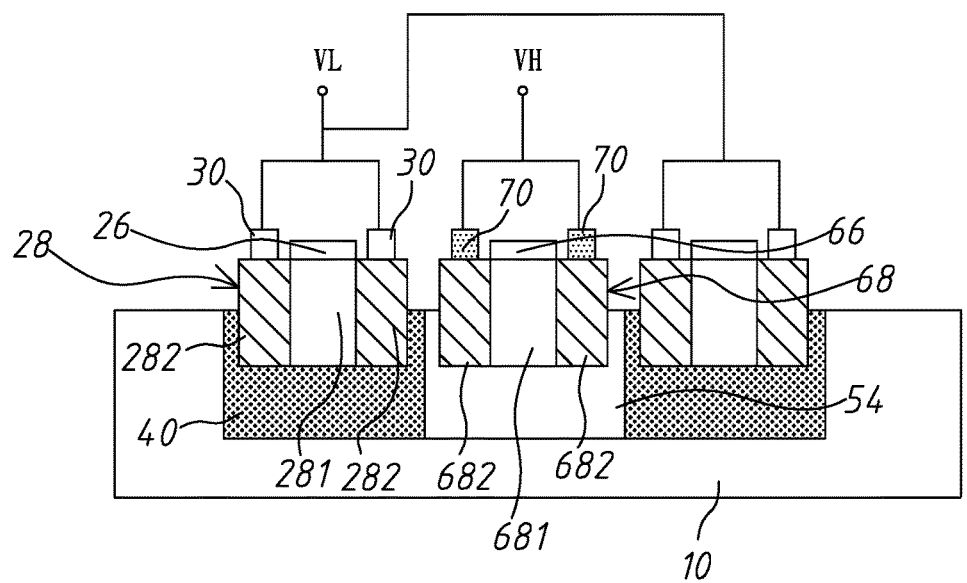
FIG. 16 is a sectional view taken along Line H-H' of FIG. 14.

In addition, the first conductivity type is an N type and the second conductivity type is a P type. In such a case, the first fin-based structures 16 cooperates with the first doped well 14 to form two PMOSFETs 42, and the second fin-based structure 18 cooperates with the first doped area 40 to form an P-type heavily doped area 44, as shown in FIG. 12. Alternatively, the first conductivity type is a P type and the second conductivity type is an N type. In such a case, the first fin-based structures 16 cooperates with the first doped well 14 to form an NMOSFETs 46, and the second fin-based structure 18 cooperates with the first doped area 40 to form an N-type heavily doped area 48, as shown in FIG. 13. The first heavily doped regions 222, the second heavily doped regions 282, the first doped well 14 and the first doped area 40 form a plurality of first BJTs. Voltages of the high voltage terminal VH and the low voltage terminal VL bias the first BJTs to generate a plurality of first ESD currents through the first BJTs. In the third embodiment, the first ESD currents flow in up and down directions.

Refer to FIG. 8, FIG. 9, FIG. 10, and FIG. 11, FIG. 14, FIG. 15 and FIG. 16. The fourth embodiment of the bipolar transistor device of the present invention is introduced as below. The difference between the fourth embodiment and the third embodiment is described as below. In the fourth embodiment, the amounts of the first transistor units 12, the first fin-based structures 16 and the second fin-based structure 18 are respectively two, two, and one. The first transistor unit 12 of the third embodiment is the same to that of the fourth embodiment. Compared with the third embodiment, the fourth embodiment further comprises at least one second transistor unit 50. In the fourth embodiment, the amount of the second transistor unit 50 is one. The second transistor unit 50 further comprises a second doped well 52 of the second conductivity type, a second doped area 54 of the first conductivity type, two third fin-based structures 56 and a fourth fin-based structure 58. For example, the second doped area 54 is a heavily doped well. The second doped well 52 is arranged in the substrate 10, and the second doped area 54 is arranged in the second doped well 52.

Each third fin-based structure 56 comprises a third gate strip 60, a plurality of third doped fins 62 and two third contacts 64. The third gate strip 60 comprises polysilicon. The third doped fins 62 are uniformly arranged in the second doped well 52, and arranged along the first direction, and each third doped fin 62 has a third doped region 621 of the second conductivity type and two third heavily doped regions 622 of the first conductivity type, and each third doped region 621 is arranged between the two third heavily doped regions 622 corresponded thereof, and the third doped regions 621 and the third heavily doped regions 622 are arranged in the second doped well 52 and protruded up from the surface of the substrate 10. The third gate strip 60 is arranged on tops and sidewalls of the third doped regions 621 and the surface of the substrate 10, and arranged along the second direction, and the third gate strip 60 is floating. The third contacts 64 are respectively used as a source and a drain. The third contacts 64 are respectively arranged on sidewalls and tops of the third heavily doped regions 622 at two opposite sides of the third doped regions 621 and the surface of the substrate 10, and arranged along the second direction, and the third heavily doped 622 regions are coupled to the low voltage terminal VL via the third contacts 64.

The fourth fin-based structure 58 comprises a fourth gate strip 66, a plurality of fourth doped fins 68 and two fourth contacts 70. The fourth gate strip 66 comprises polysilicon. The fourth doped fins 68 are uniformly arranged in the second doped area 54, and arranged along the first direction, and each fourth doped fin 68 has a fourth doped region 681 of the first conductivity type and two fourth heavily doped regions 682 of the second conductivity type, and each fourth doped region 681 is arranged between the two fourth heavily doped regions 682 corresponded thereof, and the fourth doped regions 681 and the fourth heavily doped regions 682 are arranged in the second doped area 54 and protruded up from the surface of the substrate 10. The fourth gate strip 66 is arranged on tops and sidewalls of the fourth doped regions 681 and the surface of the substrate 10, and arranged along the second direction, and the fourth gate strip 66 is floating. The fourth contacts 70 are respectively used as a source and a drain. The fourth contacts 70 are respectively arranged on sidewalls and tops of the fourth heavily doped regions 682 at two opposite sides of the fourth doped regions 681 and the surface of the substrate 10, and arranged along the second direction, and the fourth heavily doped regions 682 are coupled to the high voltage terminal VH via the fourth contacts 70.

The fourth gate strip 66 is arranged between the third gate strips 60, and the fourth gate strip 66 is connected with the third gate strips 60. The third heavily doped regions 622, the fourth heavily doped regions 682, the second doped well 52 and the second doped area 54 form a plurality of second BJTs, and the voltages of the high voltage terminal VH and the low voltage terminal VL bias the second BJTs to generate a plurality of second ESD currents through the second BJTs. The first doped wells 14 are adjacent to the second doped well 52 in an alternate way, and the first doped areas 40 are adjacent to the second doped area 54 in an alternate way. In the fourth embodiment, the first ESD currents and the second ESD current flow in up, down, left and right directions.

In addition, there are also a plurality of first transistor units 12 and a plurality of second transistor units 50 in the fourth embodiment. Each second transistor unit 50 corresponds to two first transistor units 12.

In conclusion, the present invention uses the fin-based structures to establish BJTs which discharge uniform ESD currents, so as to reduce the semiconductor failures due to ESD.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A bipolar transistor device comprising:
    a substrate; and
    at least one first transistor unit comprising:
        a first doped well of first conductivity type arranged in said substrate;
        at least one first fin-based structure comprising:
            a plurality of first doped fins uniformly arranged in said first doped well, and arranged along a first direction, and each said first doped fin has a first doped region of said first conductivity type and two first heavily doped regions of second conductivity type, and each said first doped region is arranged between said two first heavily doped regions corresponded thereof, and said first doped regions and said first heavily doped regions are arranged in said first doped well and protruded up from a surface of said substrate; and
            a first gate strip arranged on tops and sidewalls of said first doped regions and said surface of said substrate, and arranged along a second direction intersecting said first direction, and said first gate strip is floating; and
        at least one second fin-based structure comprising:
            a plurality of second doped fins uniformly arranged in said first doped well, and arranged along said first direction, and each said second doped fin has a second doped region of said first conductivity type and two second heavily doped regions of said second conductivity type, and each said second doped region is arranged between said two second heavily doped regions corresponded thereof, and said second doped regions and said second heavily doped regions are arranged in said first doped well and protruded up from said surface of said substrate; and a second gate strip arranged on tops and sidewalls of said second doped regions and said surface of said substrate, and arranged along said second direction, and said second gate strip is floating, and said first heavily doped regions, said second heavily doped regions and said first doped well form a plurality of first bipolar junction transistors (BJTs), and said first heavily doped regions are coupled to a high voltage terminal, and said second heavily doped regions are coupled to a low voltage terminal, and voltages of said high voltage terminal and said low voltage terminal bias said first BJTs to generate a plurality of first electrostatic discharge (ESD) currents through said first BJTs.

2. The bipolar transistor device according to claim 1, wherein said first conductivity type is a P type and said second conductivity type is an N type; and said first conductivity type is an N type and said second conductivity type is a P type.

3. The bipolar transistor device according to claim 1, wherein said second direction is perpendicular to said first direction.

4. The bipolar transistor device according to claim 1, wherein said first fin-based structure further comprises two first contacts respectively arranged on sidewalls and tops of said first heavily doped regions at two opposite sides of said first doped regions and said surface of said substrate, and arranged along said second direction, and said first heavily doped regions are coupled to said high voltage terminal via said first contacts; and said second fin-based structure further comprises two second contacts respectively arranged on sidewalls and tops of said second heavily doped regions at two opposite sides of said second doped regions and said surface of said substrate, and arranged along said second direction, and said second heavily doped regions are coupled to said low voltage terminal via said second contacts.

5. The bipolar transistor device according to claim 1, wherein said first gate strip and said second gate strip comprise polysilicon.

6. The bipolar transistor device according to claim 1, wherein said at least one first fin-based structure is a plurality of said first fin-based structures, and said at least one second fin-based structure is a plurality of said second fin-based structures, and said first fin-based structures and said second fin-based structures are arranged in an alternate way.

7. The bipolar transistor device according to claim 1, wherein said at least one first fin-based structure is two said first fin-based structures, and said first transistor unit further comprises a first doped area of said second conductivity type arranged in said first doped well, and said second fin-based structure is arranged between said first fin-based structures, and said second heavily doped regions and said second doped regions are arranged in said first doped area, and said second gate strip is arranged between said first gate strips, and said second gate strip is connected with said first gate strips.

8. The bipolar transistor device according to claim 7, wherein said first doped area is a doped well.

9. The bipolar transistor device according to claim 7, further comprising at least one second transistor unit, and said at least one first transistor unit is two said first transistor units, and said second transistor unit further comprises:

a second doped well of said second conductivity type arranged in said substrate;

a second doped area of said first conductivity type arranged in said second doped well;

two third fin-based structures each comprising:
a plurality of third doped fins uniformly arranged in said second doped well, and arranged along said first direction, and each said third doped fin has a third doped region of said second conductivity type and two third heavily doped regions of said first conductivity type, and each said third doped region is arranged between said two third heavily doped regions corresponded thereof, and said third doped regions and said third heavily doped regions are arranged in said second doped well and protruded up from said surface of said substrate, and said third heavily doped regions are coupled to said low voltage terminal; and a third gate strip arranged on tops and sidewalls of said third doped regions and said surface of said substrate, and arranged along said second direction, and said third gate strip is floating; and a fourth fin-based structure comprising:
a plurality of fourth doped fins uniformly arranged in said second doped area, and arranged along said first direction, and each said fourth doped fin has a fourth doped region of said first conductivity type and two fourth heavily doped regions of said second conductivity type, and each said fourth doped region is arranged between said two fourth heavily doped regions corresponded thereof, and said fourth doped regions and said fourth heavily doped regions are arranged in said second doped area and protruded up from said surface of said substrate, and said fourth heavily doped regions are coupled to said high voltage terminal; and a fourth gate strip arranged on tops and sidewalls of said fourth doped regions and said surface of said substrate, and arranged along said second direction, and said fourth gate strip is floating, and said fourth gate strip is arranged between said third gate strips, and said fourth gate strip is connected with said third gate strips, and said third heavily doped regions, said fourth heavily doped regions, said second doped well and said second doped area form a plurality of second BJTs, and said voltages of said high voltage terminal and said low voltage terminal bias said second BJTs to generate a plurality of second ESD currents through said second BJTs, and said first doped wells are adjacent to said second doped well in an alternate way, and said first doped areas are adjacent to said second doped area in an alternate way.

10. The bipolar transistor device according to claim 9, wherein said third fin-based structure further comprises two third contacts respectively arranged on sidewalls and tops of said third heavily doped regions at two opposite sides of said third doped regions and said surface of said substrate, and arranged along said second direction, and said third heavily doped regions are coupled to said low voltage terminal via said third contacts; and said fourth fin-based structure further comprises two fourth contacts respectively arranged on sidewalls and tops of said fourth heavily doped regions at two opposite sides of said fourth doped regions and said surface of said substrate, and arranged along said second direction, and said fourth heavily doped regions are coupled to said high voltage terminal via said fourth contacts.

11. The bipolar transistor device according to claim 9, wherein said third gate strips and said fourth gate strip comprise polysilicon.

12. The bipolar transistor device according to claim 9, wherein said second doped area is a doped well.

13. The bipolar transistor device according to claim 9, wherein said at least one first transistor unit is a plurality of said first transistor units, and said at least one second transistor unit is a plurality of second transistor units each corresponding to two said first transistor units.

14. The bipolar transistor device according to claim 1, wherein said substrate is a semiconductor substrate.

\* \* \* \* \*